United States Patent
Peters et al.

(10) Patent No.: US 9,583,444 B2
(45) Date of Patent: Feb. 28, 2017

(54) METHOD FOR APPLYING MAGNETIC SHIELDING LAYER, METHOD FOR MANUFACTURING A DIE, DIE AND SYSTEM

(71) Applicant: Infineon Technologies AG, Neubiberg (DE)

(72) Inventors: Christian Peters, Vaterstetten (DE); Robert Allinger, Unterhaching (DE); Klaus Knobloch, Dresden (DE); Snezana Jenei, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/970,651

(22) Filed: Aug. 20, 2013

(65) Prior Publication Data
US 2015/0054102 A1    Feb. 26, 2015

(51) Int. Cl.
*H01L 23/552* (2006.01)
*H01L 43/02* (2006.01)
*H01L 43/12* (2006.01)

(52) U.S. Cl.
CPC ............ *H01L 23/552* (2013.01); *H01L 43/02* (2013.01); *H01L 43/12* (2013.01); *H01L 2924/0002* (2013.01); *H01L 2924/3025* (2013.01); *Y10T 156/12* (2015.01)

(58) Field of Classification Search
CPC ................................................. H01L 2924/3025
USPC ............................................... 438/3; 257/659
See application file for complete search history.

(56) References Cited

U.S. PATENT DOCUMENTS

| | | | |
|---|---|---|---|
| 2010/0164077 A1* | 7/2010 | Bando et al. ................ | 257/659 |
| 2010/0193967 A1* | 8/2010 | Takamoto ..................... | 257/778 |
| 2011/0217826 A1* | 9/2011 | Sakurada ...................... | 438/462 |
| 2012/0119338 A1* | 5/2012 | Watanabe et al. ........... | 257/659 |

* cited by examiner

*Primary Examiner* — Lex Malsawma
*Assistant Examiner* — Xia L Cross
(74) *Attorney, Agent, or Firm* — Murphy, Bilak & Homiller, PLLC

(57) ABSTRACT

A method for applying a magnetic shielding layer to a substrate is provided, wherein a first magnetic shielding layer is adhered to a first surface of the substrate. A first film layer is adhered to the first magnetic shielding layer and the first magnetic shielding layer is more adherent to the first surface than the film layer to the first magnetic shielding layer.

25 Claims, 3 Drawing Sheets

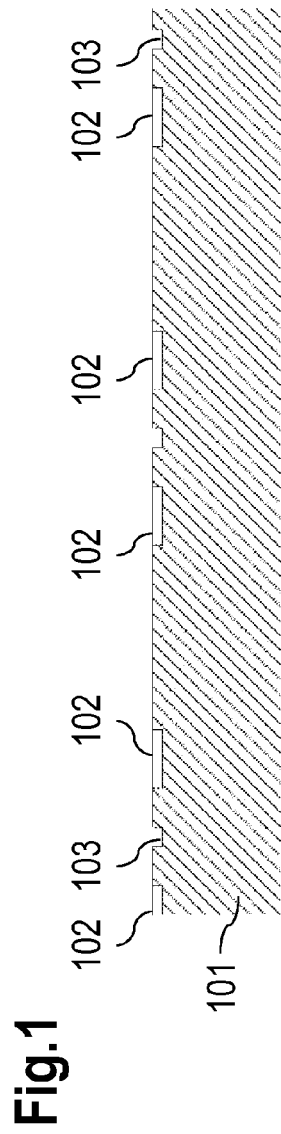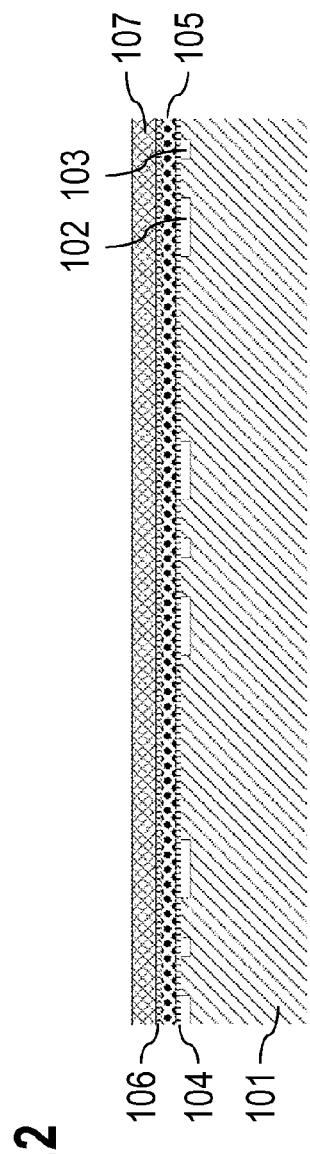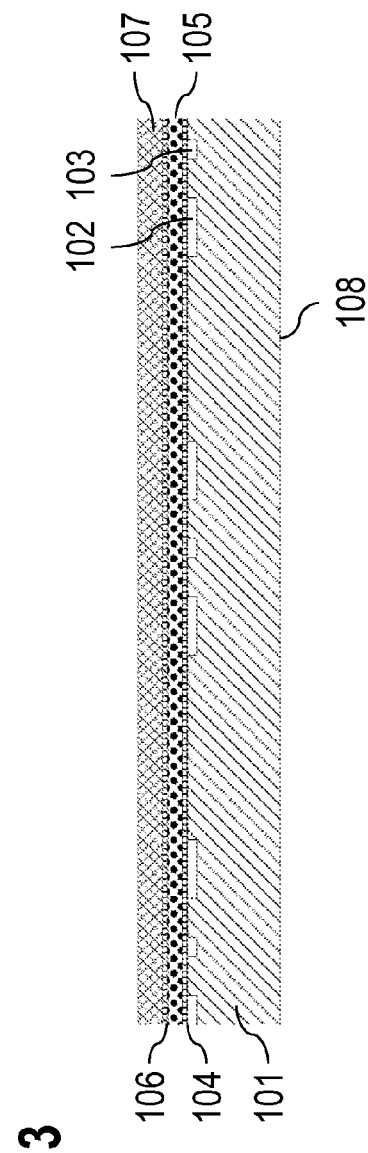

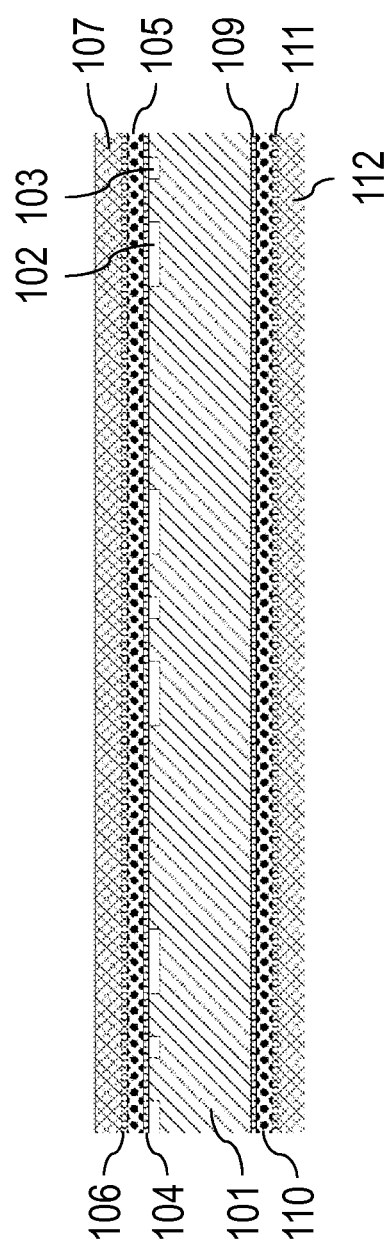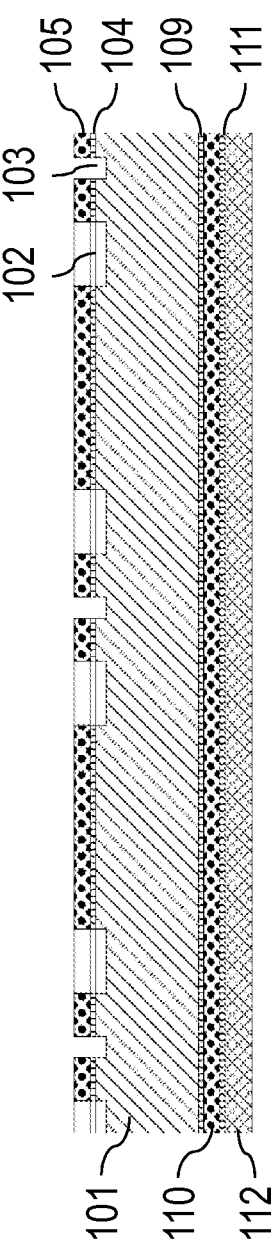
Fig.4
Fig.5

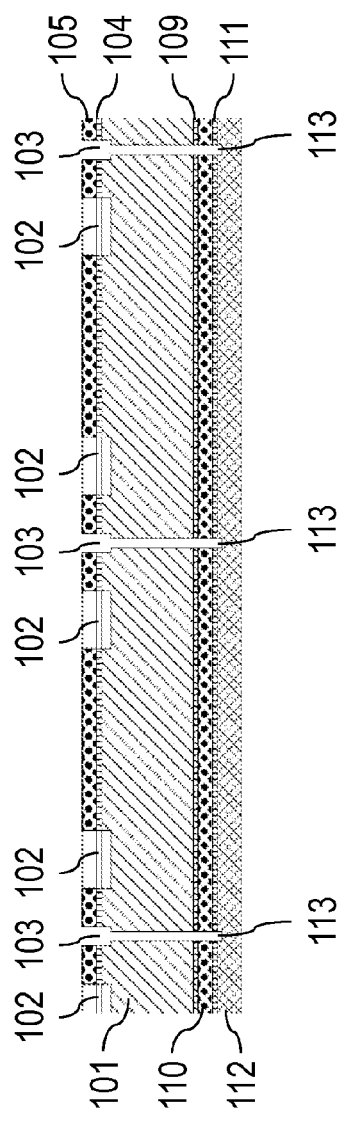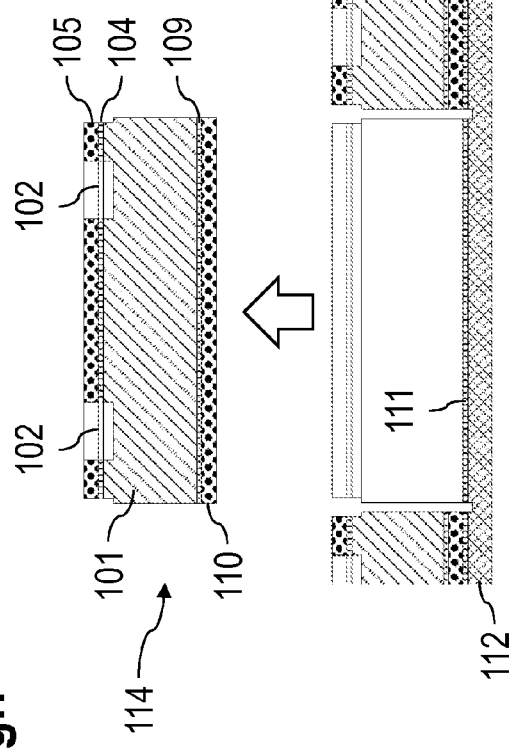

METHOD FOR APPLYING MAGNETIC SHIELDING LAYER, METHOD FOR MANUFACTURING A DIE, DIE AND SYSTEM

BACKGROUND OF THE INVENTION

Embodiments of the present invention relate to shielding of semiconductor devices, in particular memory devices.

BACKGROUND OF THE INVENTION

Magnetic semiconductor memories such as field switching MRAM or STT-MRAM devices often need an effective shielding to prevent data loss due to external magnetic fields.

Shielding can be done by applying soft-magnetic layers to the upper surface and/or to the bottom surface of the semiconductor die.

In contrast to existing solutions, which are rather complicated and expensive, an easy-to-use and cost efficient approach is provided herewith.

SUMMARY

A first embodiment relates to a method for applying a magnetic shielding layer to a substrate, wherein a first magnetic shielding layer is adhered to a first surface of the substrate. A first film layer is adhered to the first magnetic shielding layer and the first magnetic shielding layer is more adherent to the first surface than the film layer to the first magnetic shielding layer.

A second embodiment relates to a method for applying a magnetic shielding layer to a substrate, wherein a first film layer adhered to a first magnetic shielding layer is adhered via the first magnetic shielding layer to a first surface of the substrate, wherein the first magnetic shielding layer is more adherent to the first surface than the film layer to the first magnetic shielding layer.

A third embodiment relates to a method for manufacturing a die, the method comprising the following steps:
- adhering a first magnetic shielding layer to a first surface of a substrate;
- adhering a first film layer to the first magnetic shielding layer, wherein the first magnetic shielding layer is more adherent to the first surface than the film layer to the first magnetic shielding layer;
- thinning or grinding the substrate;
- adhering a second magnetic shielding layer to a second surface of the substrate;
- adhering a second film layer to the second magnetic shielding layer, wherein the second magnetic shielding layer is more adherent to the second surface than the film layer to the second magnetic shielding layer;
- removing the first film layer thereby leaving openings at the location of at least one recess, in particular at least one bond-pad and at least one scribe line;
- cutting grooves into the substrate, wherein at least two grooves extend from the first surface through the second magnetic shielding layer up to or into the second film layer;
- picking a region of the substrate separated by grooves.

A fourth embodiment is directed to a method for manufacturing a die, the method comprising the following steps:
- adhering a first film layer that is adhered to a first magnetic shielding layer via the first magnetic shielding layer to a first surface of a substrate, wherein the first magnetic shielding layer is more adherent to the first surface than the film layer to the first magnetic shielding layer;
- thinning or grinding the substrate;
- adhering a second film layer that is adhered to a second magnetic shielding layer via the second magnetic shielding layer to a second surface of the substrate, wherein the second magnetic shielding layer is more adherent to the second surface than the film layer to the second magnetic shielding layer;
- removing the first film layer thereby leaving openings at the location of at least one recess, in particular at least one bond-pad and at least one scribe line;
- cutting grooves into the substrate, wherein at least two grooves extend from the first surface through the second magnetic shielding layer up to or into the second film layer;
- picking a region of the substrate separated by grooves.

A fifth embodiment relates to a die manufactured according to a method comprising the following steps:
- adhering a first magnetic shielding layer to a first surface of a substrate;
- adhering a first film layer to the first magnetic shielding layer, wherein the first magnetic shielding layer is more adherent to the first surface than the film layer to the first magnetic shielding layer;
- thinning or grinding the substrate;
- adhering a second magnetic shielding layer to a second surface of the substrate;
- adhering a second film layer to the second magnetic shielding layer, wherein the second magnetic shielding layer is more adherent to the second surface than the film layer to the second magnetic shielding layer;
- removing the first film layer thereby leaving openings at the location of at least one recess, in particular at least one bond-pad and at least one scribe line;
- cutting grooves into the substrate, wherein at least two grooves extend from the first surface through the second magnetic shielding layer, but the grooves do not separate the second film layer;
- picking a region of the substrate separated by grooves.

A sixth embodiment is directed to a die manufactured according to a method comprising the following steps:
- adhering a first film layer that is adhered to a first magnetic shielding layer via the first magnetic shielding layer to a first surface of a substrate, wherein the first magnetic shielding layer is more adherent to the first surface than the film layer to the first magnetic shielding layer;
- thinning or grinding the substrate;
- adhering a second film layer that is adhered to a second magnetic shielding layer via the second magnetic shielding layer to a second surface of the substrate, wherein the second magnetic shielding layer is more adherent to the second surface than the film layer to the second magnetic shielding layer;
- removing the first film layer, thereby leaving openings at the location of at least one recess, in particular at least one bond-pad and at least one scribe line;
- cutting grooves into the substrate, wherein at least two grooves extend from the first surface through the second magnetic shielding layer, but the grooves do not separate the second film layer;
- picking a region of the substrate separated by grooves.

A seventh embodiment is directed to a system for applying a magnetic shielding layer to a substrate, the system comprising:

means for adhering a first magnetic shielding layer to a first surface of a substrate;

means for adhering a first film layer to the first magnetic shielding layer, wherein the first magnetic shielding layer is more adherent to the first surface than the film layer to the first magnetic shielding layer;

means for thinning or grinding the substrate;

means for adhering a second magnetic shielding layer to a second surface of the substrate;

means for adhering a second film layer to the second magnetic shielding layer, wherein the second magnetic shielding layer is more adherent to the second surface than the film layer to the second magnetic shielding layer;

means for removing the first film layer, thereby leaving openings at the location of at least one recess, in particular at least one bond-pad and at least one scribe line;

means for cutting grooves into the substrate, wherein at least two grooves extend from the first surface through the second magnetic shielding layer, but the grooves do not separate the second film layer;

means for picking a region of the substrate separated by grooves.

An eighth embodiment is directed to a system for applying a magnetic shielding layer to a substrate, the system comprising:

means for adhering a first film layer that is adhered to a first magnetic shielding layer via the first magnetic shielding layer to a first surface of a substrate, wherein the first magnetic shielding layer is more adherent to the first surface than the film layer to the first magnetic shielding layer;

means for thinning or grinding the substrate;

means for adhering a second film layer that is adhered to a second magnetic shielding layer via the second magnetic shielding layer to a second surface of the substrate, wherein the second magnetic shielding layer is more adherent to the second surface than the film layer to the second magnetic shielding layer;

means for removing the first film layer thereby leaving openings at the location of at least one recess, in particular at least one bond-pad and at least one scribe line;

means for cutting grooves into the substrate, wherein at least two grooves extend from the first surface through the second magnetic shielding layer, but the grooves do not separate the second film layer;

means for picking a region of the substrate separated by grooves.

BRIEF DESCRIPTION OF THE DRAWINGS

Embodiments are shown and illustrated with reference to the drawings. The drawings serve to illustrate basic principles, so that only aspects necessary for understanding the basic principles are illustrated. The drawings are not to scale. In the drawings the same reference characters denote like features.

FIG. 1 shows a wafer after a manufacturing process in a cross section view comprising bond-pads and scribe lines;

FIG. 2 shows the wafer of FIG. 1 with a glue layer, a magnetic shielding layer on top of the glue layer, a glue layer on top of the magnetic shielding layer and a foil attached on top of the glue layer;

FIG. 3 shows the wafer of FIG. 2 after a thinning or grinding;

FIG. 4 shows the thinned wafer of FIG. 3 with a glue layer applied on the surface with a magnetic shielding layer on top of the glue layer, with a glue layer on top of the magnetic shielding layer and with a foil attached on top of the glue layer;

FIG. 5 shows the structure of FIG. 4 after the upper foil is removed;

FIG. 6 shows the wafer of FIG. 5 after a dicing or sawing process;

FIG. 7 shows the structure of FIG. 6 and a picked die 114 removed from this structure.

DETAILED DESCRIPTION OF THE PREFERRED EMBODIMENTS

Foils used during a wafer thinning (grinding) process step and a die separation process step (dicing) may also be used to apply a magnetic shield and to avoid any additional process step.

For example, a first foil (also referred to as film or film layer) with a magnetic shielding layer (also referred to as "soft-magnetic surface layer"), wherein the shielding layer may comprise soft magnetic materials, such as, e.g., Fe and/or Ni alloy may be adhered, e.g., glued, onto the top of a substrate, e.g., wafer, before a grinding or thinning step.

After the thinning process, a second foil with the magnetic shielding layer, which may be fitted to a frame holder that is used for the sawing and die picking, may be adhered onto a backside of the thinned wafer.

The first foil on the wafer's surface may be removed, leaving the magnetic shielding layer glued to the die surface except for recessed bond pad and scribe line areas.

After die separation (e.g., wafer sawing) the dies can be picked for further processing, with the magnetic shielding layers remaining on their respective bottoms and tops.

Hereinafter, the orientation of the components shown in the figures are for illustration purposes. Hence, relations with regard to location or orientation are not limiting in any sense. The components shown may be arranged differently when implemented, manufactured or used.

FIG. 1 shows a wafer 101 after a manufacturing process in a cross-section view (not to scale) comprising bond-pads 102 and scribe lines 103. The bond-pads 102 and the scribe lines 103 are exemplary recesses. Other recesses could be used in combination with the current approach accordingly.

FIG. 2 shows the wafer 101 with a glue layer 104, a magnetic shielding layer 105 on top of the glue layer 104 and a glue layer 106 on top of the magnetic shielding layer 105. A foil 107 is attached on top of the glue layer 106.

The magnetic shielding layer may be any kind of micro metal comprising, e.g., a Fe- and/or Ni-content.

FIG. 3 shows the wafer 101 after a thinning or grinding process with a (bottom) surface 108.

FIG. 4 shows the thinned wafer 101 of FIG. 3 with a glue layer 109 applied on the surface 108 with a magnetic shielding layer 110 on top of the glue layer 109. A glue layer 111 is applied on top of the magnetic shielding layer 110 and a foil 112 is attached on top of the glue layer 111. Hence, FIG. 4 comprises a magnetic shield on top and bottom of the (thinned) wafer.

FIG. 5 shows the structure of FIG. 4 after the foil 107 is removed. As the foil 107 is attached—via the glue layer 106—to the magnetic shielding layer 105, removing this foil 107 also removes the magnetic shielding layer 105 over any recess, e.g., bond-pad 102 and scribe line 103, because at these locations the magnetic shielding layer 105 is not glued (via the glue layer 104) to the wafer 101. Hence, the magnetic shielding layer 105 only remains at spots where there is no such recess, e.g., neither a bond-pad 102 nor a scribe line 103.

FIG. 6 shows the wafer 101 after a dicing or sawing process. The dicing or sawing leads to grooves 113 that extend through the scribe lines 103 through the magnetic shielding layer 110 into the foil 112. Preferably, the grooves 113 do not cut through the foil 112.

FIG. 7 shows the wafer 101 and a picked die 114 (comprising a portion of the wafer 101). Preferably, when picked, the magnetic shielding layer 110 may remain at the die 114 and the glue layer 111 may remain with the foil 112. In other words, the picking of the die 114 may result in a separation between the foil 112 and the magnetic shielding layer 110 (at the glue layer 111). The die 114 thus has a magnetic shield on the top (at least partially) and bottom based on the magnetic shielding layers 105 and 110.

Advantageously, the glue (i.e., the adhesive effect provided, e.g., by said glue) of the magnetic shielding layers 105, 110 to the die top or bottom (glue layers 104 and 109) may be stronger than the glue (i.e., the adhesive effect provided, e.g., by said glue) of the magnetic shielding layer 105, 110 to the foil 107, 112 (glue layers 106, 111). Said adhesive effects could be provided by any other adhesive (means).

For example, small soft magnetic particles with a weak side binding can be used for the process to allow local removal (e.g., over bond-pad openings 102)

The magnetic shielding layers 105, 110 and its glue to the die via the glue layers 104, 109 may be arranged such that they withhold subsequent production processes like mounting and/or molding.

To prevent sticking of the magnetic shielding layer 105 to the bond-pads 102 a glue with strong adhesion to the chip passivation and a soft binding to the metal of the pads may be used.

The magnetic shielding layer 105 on the foil 107 may be pre-structured by, e.g., lithography, etching and/or printing methods in order to allow for pad and/or kerf openings.

The foil 107 for applying the magnetic shielding layer 105 to the chip surface could be different from the foil 112.

The approach could be used in particular for STT-MRAMs (spin transfer torque magneto-resistive random access memories). It provides an efficient and cost-effective solution for a magnetic shielding of the devices. The solution can be incorporated into a manufacturing process and allows for dramatically reducing the overall costs that come with shielding efforts.

At least one of the following examples and/or embodiments may be considered innovative. They might be combined with other aspects or embodiments as described. Any embodiment or design described herein is not necessarily to be construed as preferred or advantageous over other embodiments or designs.

A method is provided for applying a magnetic shielding layer to a substrate,
wherein a first magnetic shielding layer is adhered to a first surface of the substrate;
wherein a first film layer is adhered to the first magnetic shielding layer;
wherein the first magnetic shielding layer is more adherent to the first surface than the film layer to the first magnetic shielding layer.

It is noted that the adherence may be caused by an adhesive, in particular a glue, which could be sandwiched between, e.g., the magnetic shielding layer and the surface of the substrate and/or between the film layer and the magnetic shielding layer. A stronger adherence may be achieved by a different glue or by a different amount of glue applied between the two elements.

It is further noted that the magnetic shielding layer may stick over those portions of the substrate other than the at least one bond-pad and the at least one scribe line. In other words the first magnetic shielding layer which may be less strongly adhered to the film layer is arranged such that it can stick with the substrate to which it is more strongly adhered at portions of the surface with no recess. Hence, the magnetic shielding stays in place over such areas other than said recesses.

In an embodiment, the substrate is thinned or ground.
In an embodiment, the substrate is a wafer.
In an embodiment,
a second magnetic shielding layer is adhered to a second surface of the substrate;
a second film layer is adhered to the second magnetic shielding layer;
the second magnetic shielding layer is more adherent to the second surface than the film layer to the second magnetic shielding layer.

In an embodiment, any adherence between the magnetic shielding layer and the surface of the substrate or between the film layer and the magnetic shielding layer is provided via a glue.

In an embodiment, the glue comprises a layer of glue or several portions of glue.

In an embodiment, the second surface is on the opposite side of the first surface.

In an embodiment, the first surface comprises at least one recess, in particular at least one bond-pad and at least one scribe line.

It is an option that the at least one recess is treated such that the first magnetic shielding layer is not or not strongly adhered to the location of the recess; for that purpose, the recesses may be treated such that a glue can built no or no strong adhesive effect over such recesses.

In an embodiment, a soft-binding is applied to the at least one recess.

In an embodiment, the first film layer is removed, thereby leaving openings at the location of the at least one recess.

In an embodiment, the first film layer is removed by tearing apart the first magnetic shielding layer over said at least one recess.

In an embodiment, grooves are cut into the substrate, wherein at least two grooves extend from scribe lines through the second magnetic shielding layer, but the grooves do not separate the second film layer.

In an embodiment, the grooves extend into the second film layer.

In an embodiment, the substrate is arranged for picking at least one die.

In an embodiment, the die is a memory device, in particular a MRAM or a SST-MRAM module.

Also, memory devices, in particular magnetic semiconductor memories, are suggested which may comprise at least one of the dies.

In an embodiment, the first magnetic shielding layer and/or the second magnetic shielding layer comprise at least one of the following:
a Fe content,
a Ni content.

In an embodiment, at least one of the first magnetic shielding layer and the second magnetic shielding layer is structured to allow for pad or kerf openings.

In an embodiment, at least one of the first magnetic shielding layer and the second magnetic shielding layer is structured by at least one of the following methods:
- a lithography method;
- an etching method;
- a printing method.

In an embodiment, the first film layer and the second film layer are of the same material or of different materials.

In an embodiment, at least one of the first film layer and the second film layer comprises at least one of the following:
- a foil,
- a film of ferro-magnetic particles in a binding layer,
- a film of ferro-magnetic particles in a glue.

A method is provided for applying a magnetic shielding layer to a substrate,
- wherein a first film layer adhered to a first magnetic shielding layer is adhered via the first magnetic shielding layer to a first surface of the substrate;
- wherein the first magnetic shielding layer is more adherent to the first surface than the film layer to the first magnetic shielding layer.

In an embodiment, the substrate is thinned or ground.

In an embodiment,
- a second film layer adhered to a second magnetic shielding layer is adhered via the second magnetic shielding layer to a second surface of the substrate;
- the second magnetic shielding layer is more adherent to the second surface than the film layer to the second magnetic shielding layer.

In an embodiment, the first film layer is removed, thereby leaving openings at the location of at least one recess, in particular at least one bond-pad and at least one scribe line.

In an embodiment, grooves are cut into the substrate, wherein at least two grooves extend from scribe lines through the second magnetic shielding layer, but the grooves do not separate the second film layer.

Scribe lines may be used for cutting or sawing purposes of the substrate.

In an embodiment, the grooves extend into the second film layer.

In an embodiment, the substrate is arranged for picking at least one die.

A method for manufacturing a die is suggested, comprising the following steps:
- adhering a first magnetic shielding layer to a first surface of a substrate;
- adhering a first film layer to the first magnetic shielding layer, wherein the first magnetic shielding layer is more adherent to the first surface than the film layer to the first magnetic shielding layer;
- thinning or grinding the substrate;
- adhering a second magnetic shielding layer to a second surface of the substrate;
- adhering a second film layer to the second magnetic shielding layer, wherein the second magnetic shielding layer is more adherent to the second surface than the film layer to the second magnetic shielding layer;
- removing the first film layer thereby leaving openings at the location of at least one recess, in particular at least one bond-pad and at least one scribe line;
- cutting grooves into the substrate, wherein at least two grooves extend from the first surface through the second magnetic shielding layer up to or into the second film layer;
- picking a region of the substrate separated by grooves.

A method for manufacturing a die is provided, comprising the following steps:
- adhering a first film layer that is adhered to a first magnetic shielding layer via the first magnetic shielding layer to a first surface of a substrate, wherein the first magnetic shielding layer is more adherent to the first surface than the film layer to the first magnetic shielding layer;
- thinning or grinding the substrate;
- adhering a second film layer that is adhered to a second magnetic shielding layer via the second magnetic shielding layer to a second surface of the substrate, wherein the second magnetic shielding layer is more adherent to the second surface than the film layer to the second magnetic shielding layer;
- removing the first film layer thereby leaving openings at the location of at least one recess, in particular at least one bond-pad and at least one scribe line;
- cutting grooves into the substrate, wherein at least two grooves extend from the first surface through the second magnetic shielding layer up to or into the second film layer;
- picking a region of the substrate separated by grooves.

A die is provided manufactured according to a method that comprises the following steps:
- adhering a first magnetic shielding layer to a first surface of a substrate;
- adhering a first film layer to the first magnetic shielding layer, wherein the first magnetic shielding layer is more adherent to the first surface than the film layer to the first magnetic shielding layer;
- thinning or grinding the substrate;
- adhering a second magnetic shielding layer to a second surface of the substrate;
- adhering a second film layer to the second magnetic shielding layer, wherein the second magnetic shielding layer is more adherent to the second surface than the film layer to the second magnetic shielding layer;
- removing the first film layer thereby leaving openings at the location of at least one recess, in particular at least one bond-pad and at least one scribe line;
- cutting grooves into the substrate, wherein at least two grooves extend from the first surface through the second magnetic shielding layer, but the grooves do not separate the second film layer;
- picking a region of the substrate separated by grooves.

A die is suggested manufactured according to a method that comprises the following steps:
- adhering a first film layer that is adhered to a first magnetic shielding layer via the first magnetic shielding layer to a first surface of a substrate, wherein the first magnetic shielding layer is more adherent to the first surface than the film layer to the first magnetic shielding layer;
- thinning or grinding the substrate;
- adhering a second film layer that is adhered to a second magnetic shielding layer via the second magnetic shielding layer to a second surface of the substrate, wherein the second magnetic shielding layer is more adherent to the second surface than the film layer to the second magnetic shielding layer;
- removing the first film layer thereby leaving openings at the location of at least one recess, in particular at least one bond-pad and at least one scribe line;
- cutting grooves into the substrate, wherein at least two grooves extend from the first surface through the second magnetic shielding layer, but the grooves do not separate the second film layer;
- picking a region of the substrate separated by grooves.

A memory device is suggested comprising at least one die as described herein.

A system is provided for applying a magnetic shielding layer to a substrate, the system comprising:
- means for adhering a first magnetic shielding layer to a first surface of a substrate;
- means for adhering a first film layer to the first magnetic shielding layer, wherein the first magnetic shielding layer is more adherent to the first surface than the film layer to the first magnetic shielding layer;
- means for thinning or grinding the substrate;
- means for adhering a second magnetic shielding layer to a second surface of the substrate;
- means for adhering a second film layer to the second magnetic shielding layer, wherein the second magnetic shielding layer is more adherent to the second surface than the film layer to the second magnetic shielding layer;
- means for removing the first film layer thereby leaving openings at the location of at least one recess, in particular at least one bond-pad and at least one scribe line;
- means for cutting grooves into the substrate, wherein at least two grooves extend from the first surface through the second magnetic shielding layer, but the grooves do not separate the second film layer;
- means for picking a region of the substrate separated by grooves.

A system is provided for applying a magnetic shielding layer to a substrate, the system comprising:
- means for adhering a first film layer that is adhered to a first magnetic shielding layer via the first magnetic shielding layer to a first surface of a substrate, wherein the first magnetic shielding layer is more adherent to the first surface than the film layer to the first magnetic shielding layer;
- means for thinning or grinding the substrate;
- means for adhering a second film layer that is adhered to a second magnetic shielding layer via the second magnetic shielding layer to a second surface of the substrate, wherein the second magnetic shielding layer is more adherent to the second surface than the film layer to the second magnetic shielding layer;
- means for removing the first film layer thereby leaving openings at the location of at least one recess, in particular at least one bond-pad and at least one scribe line;
- means for cutting grooves into the substrate, wherein at least two grooves extend from the first surface through the second magnetic shielding layer, but the grooves do not separate the second film layer;
- means for picking a region of the substrate separated by grooves.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

The invention claimed is:

1. A method for applying a magnetic shielding layer to a substrate,
    wherein a first magnetic shielding layer is adhered to a first surface of the substrate;
    wherein a first film layer is adhered to the first magnetic shielding layer;
    wherein the first magnetic shielding layer is more adherent to the first surface than the first film layer to the first magnetic shielding layer,
    wherein the first surface comprises at least one recessed bond-pad and at least one recessed scribe line,
    wherein the first film layer is completely removed from the first magnetic shielding layer by tearing apart the first magnetic shielding layer over said at least one recessed bond pad and at least one recessed scribe line and forming openings within the first magnetic shielding layer at the location of said at least one recessed bond pad and at least one recessed scribe line.

2. The method according to claim 1, wherein the substrate is thinned or ground.

3. The method according to claim 1, wherein the substrate is a wafer.

4. The method according to claim 2,
    wherein a second magnetic shielding layer is adhered to a second surface of the substrate;
    wherein a second film layer is adhered to the second magnetic shielding layer;
    wherein the second magnetic shielding layer is more adherent to the second surface than the second film layer to the second magnetic shielding layer.

5. The method according to claim 4, wherein any adherence between the magnetic shielding layers and the surface of the substrate or between the film layers and the magnetic shielding layer is provided via a glue.

6. The method according to claim 5, wherein the glue comprises a layer of glue or several portions of glue.

7. The method according to claim 4, wherein the second surface is on the opposite side of the first surface.

8. The method according to claim 4, wherein the first magnetic shielding layer and/or the second magnetic shielding layer comprise at least one of the following:
    a Fe content,
    a Ni content.

9. The method according to claim 4, wherein at least one of the first magnetic shielding layer and the second magnetic shielding layer is structured to allow for pad or kerf openings.

10. The method according to claim 9, wherein at least one of the first magnetic shielding layer and the second magnetic shielding layer is structured by at least one of the following methods:
    a lithography method;
    an etching method;
    a printing method.

11. The method according to claim 4, wherein the first film layer and the second film layer are of different materials.

12. The method according to claim 4, wherein at least one of the first film layer and the second film layer comprises at least one of the following:
    a foil,
    a film of ferro-magnetic particles in a binding layer,
    a film of ferro-magnetic particles in a glue.

13. The method according to claim 1, wherein a soft-binding is applied to the at least one recessed bond pad.

14. The method according to claim 1, wherein grooves are cut into the substrate, wherein at least two grooves extend from scribe lines through the second magnetic shielding layer, but the grooves do not separate the second film layer.

15. The method according to claim 14, wherein the grooves extend into the second film layer.

16. The method according to claim 14, wherein the substrate is arranged for picking at least one die.

17. The method according to claim 16, wherein the die is a memory device, in particular a MRAM or a SST-MRAM module.

18. A method for applying a magnetic shielding layer to a substrate,
   wherein a first film layer adhered to a first magnetic shielding layer is adhered via the first magnetic shielding layer to a first surface of the substrate;
   wherein the first magnetic shielding layer is more adherent to the first surface than the first film layer to the first magnetic shielding layer,
   wherein the first surface comprises at least one recessed bond-pad and at least one recessed scribe line,
   wherein the first film layer is completely removed from the first magnetic shielding layer by tearing apart the first magnetic shielding layer over said at least one recessed bond pad and at least one recessed scribe line and forming openings within the first magnetic shielding layer at the location of said at least one recessed bond pad and at least one recessed scribe line.

19. The method according to claim 18, wherein the substrate is thinned or ground.

20. The method according to claim 19,
   wherein a second film layer adhered to a second magnetic shielding layer is adhered via the second magnetic shielding layer to a second surface of the substrate;
   wherein the second magnetic shielding layer is more adherent to the second surface than the second film layer to the second magnetic shielding layer.

21. The method according to claim 20, wherein grooves are cut into the substrate, wherein at least two grooves extend from scribe lines through the second magnetic shielding layer, but the grooves do not separate the second film layer.

22. The method according to claim 21, wherein the grooves extend into the second film layer.

23. The method according to claim 22, wherein the substrate is arranged for picking at least one die.

24. A method for manufacturing a die, the method comprising:
   adhering a first magnetic shielding layer to a first surface of a substrate;
   adhering a first film layer to the first magnetic shielding layer, wherein the first magnetic shielding layer is more adherent to the first surface than the first film layer to the first magnetic shielding layer;
   thinning or grinding the substrate;
   adhering a second magnetic shielding layer to a second surface of the substrate;
   adhering a second film layer to the second magnetic shielding layer, wherein the second magnetic shielding layer is more adherent to the second surface than the second film layer to the second magnetic shielding layer;
   removing the first film layer thereby leaving openings at the location of at least one recessed bond-pad and at least one recessed scribe line;
   cutting grooves into the substrate, wherein at least two grooves extend from the first surface through the second magnetic shielding layer up to or into the second film layer;
   picking a region of the substrate separated by grooves,
   wherein the first film layer is completely removed from the first magnetic shielding layer by tearing apart the first magnetic shielding layer over said at least one recessed bond pad and at least one recessed scribe line and forming the openings within the first magnetic shielding layer at the location of said at least one recessed bond pad and at least one recessed scribe line.

25. A method for manufacturing a die, the method comprising:
   adhering a first film layer that is adhered to a first magnetic shielding layer via the first magnetic shielding layer to a first surface of a substrate, wherein the first magnetic shielding layer is more adherent to the first surface than the first film layer to the first magnetic shielding layer;
   thinning or grinding the substrate;
   adhering a second film layer that is adhered to a second magnetic shielding layer via the second magnetic shielding layer to a second surface of the substrate, wherein the second magnetic shielding layer is more adherent to the second surface than the film second layer to the second magnetic shielding layer;
   removing the first film layer thereby leaving openings at the location of at least one recessed bond-pad and at least one recessed scribe line;
   cutting grooves into the substrate, wherein at least two grooves extend from the first surface through the second magnetic shielding layer up to or into the second film layer;
   picking a region of the substrate separated by grooves,
   wherein the first film layer is completely removed from the first magnetic shielding layer by tearing apart the first magnetic shielding layer over said at least one recessed bond pad and at least one recessed scribe line and forming the openings within the first magnetic shielding layer at the location of said at least one recessed bond pad and at least one recessed scribe line.

* * * * *